United States Patent
Akiyama et al.

(10) Patent No.: US 10,263,324 B2
(45) Date of Patent: Apr. 16, 2019

(54) IMPEDANCE CONVERSION ELEMENT AND COMMUNICATION DEVICE

(71) Applicant: Murata Manufacturing Co., Ltd., Nagaokakyo-shi, Kyoto-fu (JP)

(72) Inventors: Hisashi Akiyama, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/662,325

(22) Filed: Jul. 28, 2017

(65) Prior Publication Data

US 2017/0324158 A1 Nov. 9, 2017

Related U.S. Application Data

(63) Continuation of application No. PCT/JP2016/055969, filed on Feb. 29, 2016.

(30) Foreign Application Priority Data

Mar. 11, 2015 (JP) .................................. 2015-048099

(51) Int. Cl.
*H01Q 1/50* (2006.01)
*H01Q 7/00* (2006.01)
(Continued)

(52) U.S. Cl.
CPC ................. *H01Q 1/50* (2013.01); *H01Q 5/50* (2015.01); *H01Q 7/00* (2013.01); *H01Q 1/243* (2013.01); *H03H 7/38* (2013.01)

(58) Field of Classification Search
CPC .. H01Q 7/06; H01Q 1/50; H01Q 5/50; H01Q 7/00; H01Q 1/243; H04B 1/0053; H03H 7/38
(Continued)

(56) References Cited

U.S. PATENT DOCUMENTS 8,991,713 B2 3/2015 Dokai et al.
2012/0127049 A1* 5/2012 Kato .................. H01P 1/20345
343/749
(Continued)

FOREIGN PATENT DOCUMENTS

JP 2012-085250 A 4/2012
WO 2012/096365 A1 7/2012
(Continued)

OTHER PUBLICATIONS

Official Communication issued in International Patent Application No. PCT/JP2016/055969, dated May 17, 2016.

*Primary Examiner* — Hai V Tran
(74) *Attorney, Agent, or Firm* — Keating & Bennett, LLP

(57) ABSTRACT

A first end of a first conductor pattern of a first coil conductor is connected to a power supply terminal, and a second end of the first conductor pattern is connected to an antenna terminal. A second conductor pattern includes second coil conductors. A first end of the second conductor pattern is connected to the antenna terminal and the second end of the first conductor pattern, and a second end of the second conductor pattern is connected to a ground terminal. The second conductor pattern magnetically couples with the first conductor pattern. The second end of the first conductor pattern and the first end of the second conductor pattern are connected to the antenna terminal via a routing pattern that extends to magnetically couple with at least either the first conductor pattern or the second conductor pattern.

19 Claims, 7 Drawing Sheets

(51) Int. Cl.
*H01Q 5/50* (2015.01)
*H03H 7/38* (2006.01)
*H01Q 1/24* (2006.01)

(58) Field of Classification Search
USPC .................................................. 343/749, 702
See application file for complete search history.

(56) References Cited

U.S. PATENT DOCUMENTS

| | | |
|---|---|---|
| 2012/0139814 A1 | 6/2012 | Ishizuka et al. |
| 2012/0274431 A1* | 11/2012 | Kato ................... H01P 1/20345 336/182 |
| 2013/0200162 A1 | 8/2013 | Dokai et al. |
| 2014/0078014 A1* | 3/2014 | Kato ........................ H03H 7/38 343/860 |
| 2014/0218246 A1* | 8/2014 | Ishizuka ................ H01Q 5/335 343/749 |
| 2014/0266964 A1* | 9/2014 | Kato ...................... H01Q 5/335 343/860 |
| 2014/0320252 A1 | 10/2014 | Sun et al. |
| 2015/0035718 A1* | 2/2015 | Gouchi ................. H05K 1/165 343/788 |
| 2015/0178434 A1 | 6/2015 | Ishizuka et al. |
| 2015/0180440 A1 | 6/2015 | Ishizuka |
| 2016/0248450 A1* | 8/2016 | Ishizuka ................. H03H 7/38 |

FOREIGN PATENT DOCUMENTS

| | | |
|---|---|---|
| WO | 2014/050482 A1 | 4/2014 |
| WO | 2014/050552 A1 | 4/2014 |
| WO | 2014/179240 A1 | 11/2014 |
| WO | 2015/068613 A1 | 5/2015 |

* cited by examiner

IMPEDANCE CONVERSION ELEMENT AND COMMUNICATION DEVICE

CROSS REFERENCE TO RELATED APPLICATIONS

This application claims the benefit of priority to Japanese Patent Application No. 2015-048099 filed on Mar. 11, 2015 and is a Continuation Application of PCT Application No. PCT/JP2016/055969 filed on Feb. 29, 2016. The entire contents of each application are hereby incorporated herein by reference.

BACKGROUND OF THE INVENTION

1. Field of the Invention

The present invention relates to an impedance conversion element including a conductor pattern on a multilayer body that includes laminated insulating layers, and a communication device including the impedance conversion element.

2. Description of the Related Art

As an impedance conversion element, there is, for example, an impedance conversion element disclosed in International Publication No. 2014/050482 or International Publication No. 2014/050552. As shown in FIG. 9A, the impedance conversion element includes a transformer including a primary-side coil L1 and a secondary-side coil L2. A first end of the coil L1 is connected to a power supply terminal T1. A second end of the coil L1 and a first end of the coil L2 are connected to an antenna terminal T2 via a routing wire. A second end of the coil L2 is connected to ground. The power supply terminal T1 is connected to a power supply circuit. The antenna terminal T2 is connected to an antenna element. The coil L1 and the coil L2 magnetically couple with each other. In the impedance conversion element, it is possible to provide impedance matching between the antenna element and the power supply circuit by converting impedance with the transformer.

The transformer is equivalently represented by an ideal transformer having no frequency characteristics and a parasitic inductance having frequency characteristics. Thus, in the case of providing matching by using the impedance conversion element disclosed in International Publication No. 2014/050482 or International Publication No. 2014/050552, it is possible to provide matching in a wider band as the parasitic inductance is decreased.

However, in an actual impedance conversion element, the routing wire which connects the coils L1 and L2 to the antenna terminal T2 is long as shown in FIG. 9B, and thus the inductance of the routing wire cannot be neglected. The inductance of the routing wire increases the parasitic inductance of the impedance conversion element. Therefore, it is difficult to provide matching between the antenna element and the power supply circuit in a wide band.

SUMMARY OF THE INVENTION

Preferred embodiments of the present invention provide impedance conversion elements that provide matching between an antenna element and a power supply circuit in a wide band, and communication devices including the impedance conversion elements.

An impedance conversion element of the present invention includes a multilayer body, an antenna terminal, a power supply terminal, a ground terminal, a first conductor pattern, and a second conductor pattern. The multilayer body includes a plurality of laminated insulating layers. The antenna terminal is provided on a surface of the multilayer body and connected to an antenna element. The power supply terminal is provided on the surface of the multilayer body and connected to a power supply circuit. The ground terminal is provided on the surface of the multilayer body and connected to ground. The first conductor pattern is provided within the multilayer body. A first end of the first conductor pattern is connected to the power supply terminal, and a second end of the first conductor pattern is connected to the antenna terminal. The first conductor pattern includes a loop-shaped portion. The second conductor pattern is provided within the multilayer body. A first end of the second conductor pattern is connected to the antenna terminal and the second end of the first conductor pattern, and a second end of the second conductor pattern is connected to the ground terminal. The second conductor pattern magnetically couples with the first conductor pattern and includes a loop-shaped portion. The second end of the first conductor pattern and the first end of the second conductor pattern are connected to the antenna terminal via a routing pattern. The routing pattern extends to magnetically couple with at least either the first conductor pattern or the second conductor pattern.

In this configuration, by the routing pattern magnetically coupling with the first conductor pattern and the second conductor pattern, the parasitic inductance of the impedance conversion element is equivalently decreased. Accordingly, the transformer of the impedance conversion element is close to an ideal transformer, and thus it is possible to provide matching between the antenna element and the power supply circuit in a wide band.

In an impedance conversion element according to a preferred embodiment of the present invention, the routing pattern is preferably disposed between the first conductor pattern and the second conductor pattern in a lamination direction of the multilayer body and magnetically couples with both the first conductor pattern and the second conductor pattern. In this configuration, even though the routing pattern does not have a loop shape, it is possible to increase the degree of coupling between the routing pattern and the first and second conductor patterns.

In an impedance conversion element according to a preferred embodiment of the present invention, the routing pattern preferably has a lower inductance than the first conductor pattern. In this configuration, it is possible to increase an impedance conversion ratio.

A communication device according to a preferred embodiment of the present invention includes an impedance conversion element, an antenna element, and a power supply circuit. The impedance conversion element includes a multilayer body, an antenna terminal, a power supply terminal, a ground terminal, a first conductor pattern, and a second conductor pattern. The multilayer body includes a plurality of laminated insulating layers. The antenna terminal is provided on a surface of the multilayer body. The power supply terminal is provided on the surface of the multilayer body. The ground terminal is provided on the surface of the multilayer body and connected to ground. The first conductor pattern is provided within the multilayer body. A first end of the first conductor pattern is connected to the power supply terminal, and a second end of the first conductor pattern is connected to the antenna terminal. The first conductor pattern includes a loop-shaped portion. The second conductor pattern is provided within the multilayer body. A first end of the second conductor pattern is connected to the antenna terminal and the second end of the first conductor pattern, and a second end of the second conductor pattern is connected to the ground terminal. The second conductor pattern magnetically couples with the first conductor pattern and includes a loop-shaped portion. The second end of the first conductor pattern and the first end of the second conductor pattern are connected to the antenna terminal via a routing pattern. The routing pattern extends to magnetically couple with at least either the first conductor pattern or the second conductor pattern. The antenna element is connected to the antenna terminal. The power supply circuit is connected to the power supply terminal. In this configuration, it is possible to perform communication in a state where impedance matching is provided between the antenna element and the power supply circuit in a wide band.

According to various preferred embodiments of the present invention, impedance conversion elements that provide matching between an antenna element and a power supply circuit in a wide band, and communication devices including the impedance conversion elements, are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Impedance conversion elements and communication devices according to preferred embodiments of the present invention will be described. An impedance conversion element according to the present preferred embodiment preferably is a surface mount device that converts the impedance of a high-frequency signal in the UHF band or the like. In a portable wireless communication terminal such as a smartphone, the impedance of an antenna element is relatively low due to restriction of the size thereof. Therefore, the impedance conversion element provides impedance matching between the antenna element and a power supply circuit by decreasing the impedance at the antenna element side.

Figure 1:
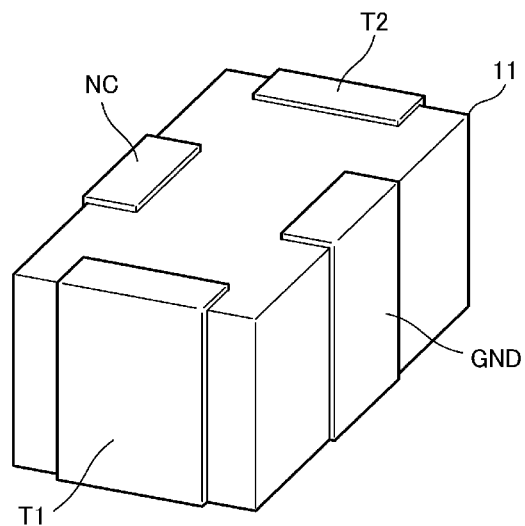
FIG. 1 is a perspective view of an impedance conversion element 10.

FIG. 1 is a perspective view of an impedance conversion element 10 according to the present preferred embodiment. The impedance conversion element 10 includes a multilayer body 11 including a plurality of insulating layers, and a transformer including a primary coil and a secondary coil and an impedance conversion circuit including the transformer are provided within the multilayer body 11. A power supply terminal T1, an antenna terminal T2, a ground terminal GND, and a vacant (Non-Connect) terminal NC are provided on the outer surface of the multilayer body 11. These terminals are provided on the lower surface, the side surface, and the upper surface of the multilayer body.

Figure 2:
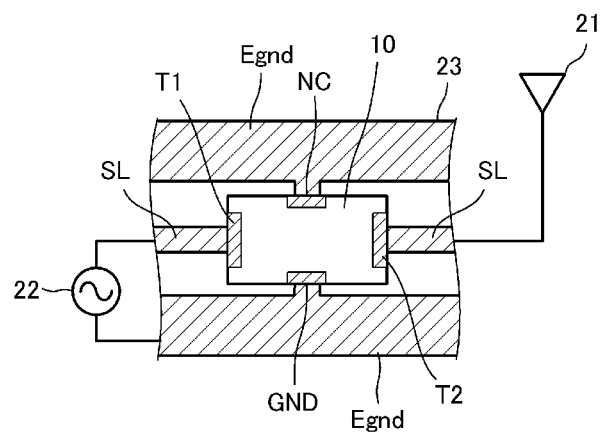
FIG. 2 is a plan view showing a structure in which the impedance conversion element 10 is mounted to a board 23.

FIG. 2 is a plan view showing a structure in which the impedance conversion element 10 is mounted to a board 23 such as a printed wiring board. A transmission line with a coplanar line structure is provided on the board 23 by a ground conductor Egnd and a signal line SL. An antenna element 21 and a power supply circuit 22 are connected to the transmission line. The impedance conversion element 10 is mounted to the board 23 via a conductive binder such as solder such that the power supply terminal T1 and the antenna terminal T2 are connected in series to the middle of the transmission line (the middle of the signal line SL) and the ground terminal GND and the vacant terminal NC are connected to the ground conductor Egnd.

As described above, the shape of the multilayer body of the impedance conversion element 10 preferably is a rectangular or substantially rectangular parallelepiped shape, the power supply terminal T1 and the antenna terminal T2 are provided on a first side (side surface) and a second side (side surface) that face each other in a plan view, respectively, and the ground terminal GND is provided on one of a third side (side surface) and a fourth side (side surface) that face each other in a plan view. Thus, it is possible to easily dispose the impedance conversion element 10 on the transmission line between the power supply circuit and the antenna element.

Figure 3:
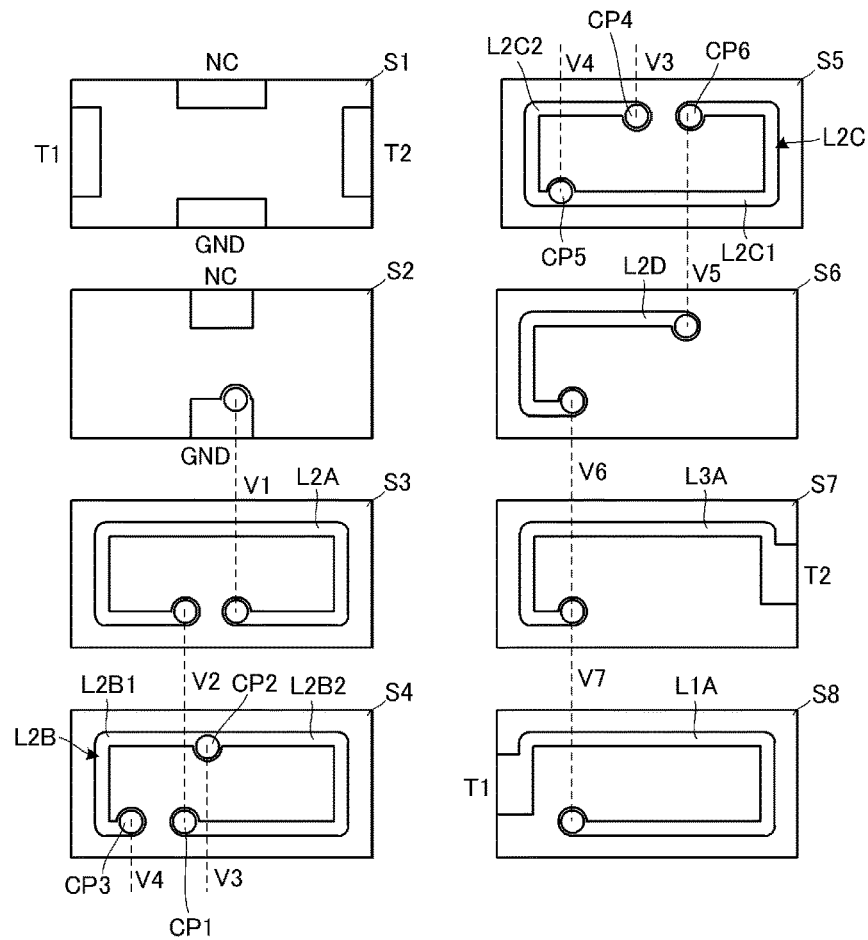
FIG. 3 is an exploded plan view of the impedance conversion element 10.

FIG. 3 is an exploded plan view of the impedance conversion element 10. The impedance conversion element 10 includes a plurality of insulating layers S1 to S8. Various conductor patterns are provided in and on the layers S1 to S8. The "various conductor patterns" include not only conductor patterns provided on the surfaces of the layers but also interlayer connection conductors. The interlayer connection conductors include not only via-conductors but also end surface electrodes provided on end surfaces of the multilayer body 11 (see FIG. 1).

In the case where the impedance conversion element 10 is a ceramic multilayer component, for example, each of the layers is a nonmagnetic ceramic layer having a low dielectric constant, and the conductive patterns are printing patterns of a conductive material such as a copper paste. In the case where the impedance conversion element 10 is a resin multilayer component, for example, the layers are sheets of a resin material, and the conductive patterns are obtained by patterning metal foil such as Al foil or Cu foil.

The upper surface of the layer S1 corresponds to a mount surface (lower surface) of the multilayer body 11. The power supply terminal T1, the antenna terminal T2, the ground terminal GND, and the vacant terminal NC are provided on the layer S1. The ground terminal GND and the vacant terminal NC are provided on the layer S2. Second coil conductors L2A to L2D are provided on the layers S3 to S6, respectively. A routing pattern L3A is provided on the layer S7. A first coil conductor L1A is provided on the layer S8. The routing pattern L3A is disposed between the first coil conductor L1A and the second coil conductor L2D in the lamination direction of the multilayer body 11.

The first coil conductor L1A, the second coil conductors L2A to L2D, and the routing pattern L3A extend along the edge of the multilayer body 11 in a plan view. The first coil conductor L1A and the second coil conductors L2A to L2C have loop shapes and preferably have the same or substantially the same shape (the outer diameter dimensions, the inner diameter dimensions, and the winding axes thereof are the same or substantially the same). The second coil conductor L2D and the routing pattern L3A coincide or substantially coincide with a portion of the first coil conductor L1A and the second coil conductors L2A to L2C in a plan view. It should be noted that each coil conductor and the routing pattern provided on the adjacent layers may have different line widths in order to alleviate capacitance variations due to lamination displacement of each base.

A first end of the first coil conductor L1A is connected to the power supply terminal T1. A second end of the first coil conductor L1A and a first end of the routing pattern L3A are connected to each other through a via-conductor V7. A second end of the routing pattern L3A is connected to the antenna terminal T2. The first end of the routing pattern L3A and a first end of the second coil conductor L2D are connected to each other through a via-conductor V6. A second end of the second coil conductor L2D and a first end (a connection point CP6) of the second coil conductor L2C are connected to each other through a via-conductor V5. A connection point CP5 of the second coil conductor L2C and a first end (a connection point CP3) of the second coil conductor L2B are connected to each other through a via-conductor V4. A second end (a connection point CP4) of the second coil conductor L2C and a connection point CP2 of the second coil conductor L2B are connected to each other through a via-conductor V3. A second end (a connection point CP1) of the second coil conductor L2B and a first end of the second coil conductor L2A are connected to each other through a via-conductor V2. A second end of the second coil conductor L2A and the ground terminal GND are connected to each other through a via-conductor V1.

In the impedance conversion element 10, when a current flows through each conductor pattern, a magnetic field is generated at a center portion of the multilayer body 11 in a plan view so as to be directed in the lamination direction of the multilayer body 11. Accordingly, the first coil conductor L1A, the second coil conductors L2A to L2D, and the routing pattern L3A magnetically couple with each other.

Figure 4:
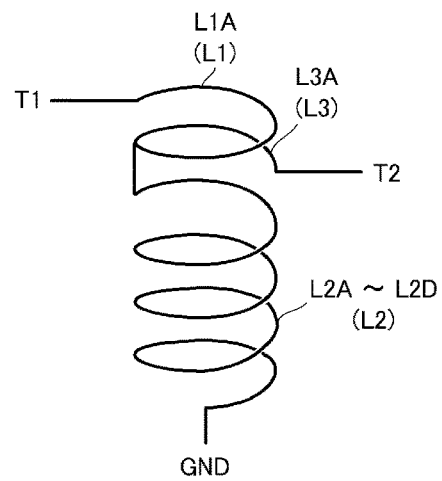
FIG. 4 is a schematic conceptual diagram of the impedance conversion element 10.

FIG. 4 is a schematic conceptual diagram of the impedance conversion element 10. The first coil conductor L1A defines a coil L1 with one turn, for example. The coil L1 is the primary coil of the transformer. The coil L1 is an example of a "first conductor pattern". The second coil conductors L2A to L2D and the via-conductors V2 to V5 define a clockwise coil L2 with approximately 3.5 turns, for example. The coil L2 is the secondary coil of the transformer. The coil L2 is an example of a "second conductor pattern". The routing pattern L3A is a routing wire from the transformer to the antenna terminal T2 and defines a coil L3 with approximately 0.5 turn, for example. The impedance conversion element 10 is designed such that the inductance of the routing pattern L3A (coil L3) is lower than the inductance of the coil L1. As shown in FIGS. 3 and 4, the routing pattern L3A is disposed between the coil L1 and the coil L2 in the lamination direction of the multilayer body 11. Thus, it is possible to increase the degree of coupling between the routing pattern L3A and the coils L1 and L2 even though the routing pattern L3A does not have a loop shape.

Figure 5:
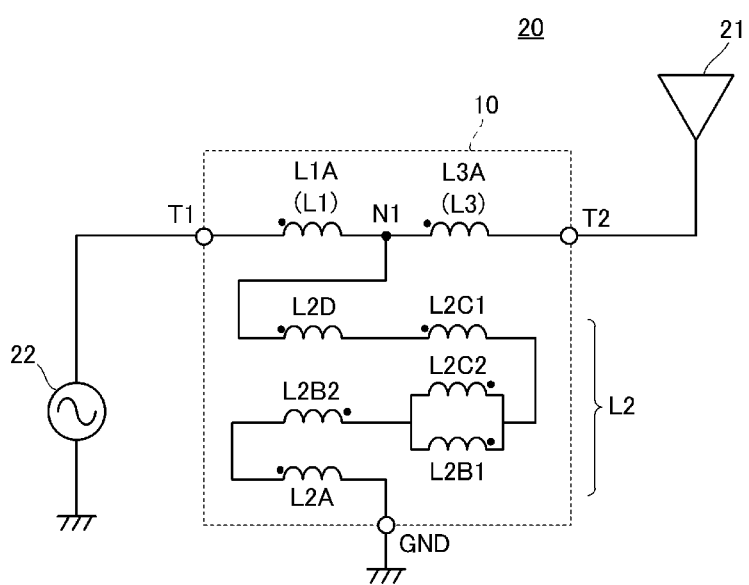
FIG. 5 is a circuit diagram of the impedance conversion element 10 and a communication device 20.

FIG. 5 is a circuit diagram of the impedance conversion element 10 and a communication device 20. In FIG. 5, a circuit diagram is shown in consideration of the positional relationship of each conductor pattern shown in FIG. 3. The first end of the first coil conductor L1A is connected to the power supply terminal T1. The second end of the first coil conductor L1A is connected to the antenna terminal T2 via the routing pattern L3A. A connection point N1 between the first coil conductor L1A and the routing pattern L3A is connected to the ground terminal GND via the second coil conductors L2A, L2B1, L2B2, L2C1, L2C2, and L2D. The second coil conductor L2B1 and L2B2 are each a portion of the second coil conductor L2B as shown in FIG. 3. The second coil conductors L2C1 and L2C2 are each a portion of the second coil conductor L2C as shown in FIG. 3. The second coil conductor L2B1 and the second coil conductor L2C2 define a parallel circuit, the second coil conductors L2B2 and L2C1 are connected to the parallel circuit. The second coil conductor L2B2 and the ground terminal GND are connected to each other via the second coil conductor L2A. The second coil conductor L2C1 and the connection point N1 are connected to each other via the second coil conductor L2D.

Figure 6A:
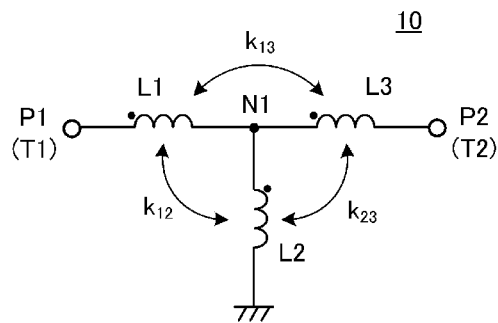
FIG. 6A is an equivalent circuit diagram of the impedance conversion element 10.

FIG. 6A is an equivalent circuit diagram of the impedance conversion element 10. In FIG. 6A, a port P1 corresponds to the power supply terminal T1, and a port P2 corresponds to the antenna terminal T2. The coil L1 is connected between the connection point N1 and the port P1. The coil L2 is connected between the connection point N1 and ground. The coil L3 is connected between the connection point N1 and the port P2. The coil L1 and the coil L2 magnetically couple with each other with a coupling coefficient $k_{12}$. The coil L1 and the coil L2 define the transformer as described above. The coil L2 and the coil L3 magnetically couple with each other with a coupling coefficient $k_{23}$. The coil L1 and the coil L3 magnetically couple with each other with a coupling coefficient $k_{13}$.

Figure 6B:
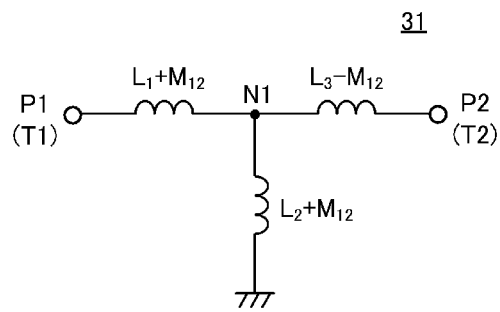
FIG. 6B is an equivalent circuit diagram of the impedance conversion element 10 when only magnetic coupling between a coil L1 and a coil L2 is taken into consideration.
Figure 6C:
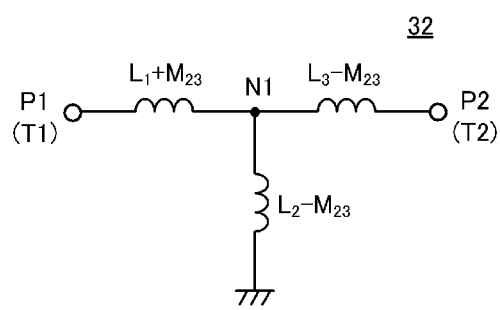
FIG. 6C is an equivalent circuit diagram of the impedance conversion element 10 when only magnetic coupling between the coil L2 and a coil L3 is taken into consideration.

FIG. 6B shows an equivalent circuit 31 of the impedance conversion element 10 when only magnetic coupling between the coil L1 and the coil L2 is taken into consideration. FIG. 6C shows an equivalent circuit 32 of the impedance conversion element 10 when only magnetic coupling between the coil L2 and the coil L3 is taken into consideration. Here, $L_1$ is the inductance of the coil L1, $L_2$ is the inductance of the coil L2, and $L_3$ is the inductance of the coil L3. $M_{12}$ is the mutual inductance between the coil L1 and the coil L2, and $M_{23}$ is the mutual inductance between the coil L2 and the coil L3.

In the equivalent circuit 31, the inductance of each coil (e.g., the inductance between the port P1 and the connection point N1) changes in response to the mutual inductance $M_{12}$. In the equivalent circuit 32, the inductance of each coil changes in response to the mutual inductance $M_{23}$. When the mutual inductance between the coil L1 and the coil L3 is $M_{13}$, the exact equivalent circuit of the impedance conversion element 10 in which all the mutual inductances $M_{12}$, $M_{23}$, and $M_{13}$ are taken into consideration is a combination of the equivalent circuit 31, the equivalent circuit 32, and an equivalent circuit (not shown) in which only the mutual inductance $M_{13}$ is taken into consideration. That is, in the exact equivalent circuit of the impedance conversion element 10, the inductance of each coil changes in response to the mutual inductances $M_{12}$, $M_{23}$, and $M_{13}$.

Figure 7A:
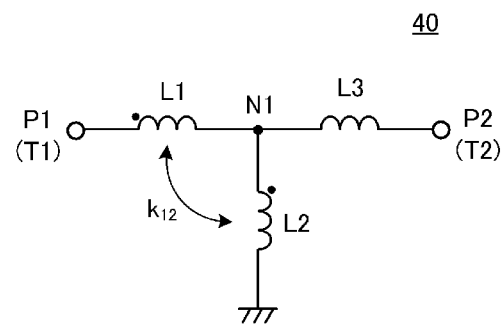
FIG. 7A is an equivalent circuit diagram of an impedance conversion element 40 of a comparative example.
Figure 7B:
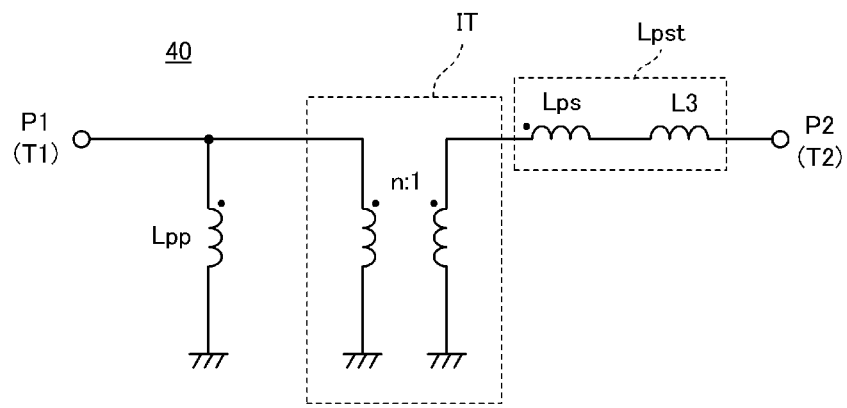
FIG. 7B is an equivalent circuit diagram of the impedance conversion element 40 including an ideal transformer IT and parasitic inductances Lpp and Lps.

FIG. 7A is an equivalent circuit diagram of an impedance conversion element 40 of a comparative example. In the impedance conversion element 40, a coil L3 does not magnetically couple with coils L1 and L2. The other configuration of the impedance conversion element 40 is the same as the configuration of the impedance conversion element 10. FIG. 7B is an equivalent circuit diagram of the impedance conversion element 40 composed of an ideal transformer IT and parasitic inductances Lpp and Lps. The parasitic inductance Lpp is shunt-connected at the primary side of the ideal transformer IT. The parasitic inductance Lps is series-connected at the secondary side of the ideal transformer IT. The parasitic inductances Lpp and Lps are a remaining part obtained by eliminating the ideal transformer IT from a transformer including the coils L1 and L2. A parasitic inductance Lpst includes the parasitic inductance Lps and the coil L3. The parasitic inductances Lpp and Lpst and a transformer ratio n satisfy the following relationship.

$Lpp = L_1 + L_2 + 2M_{12}$ $Lpst = \{(1-k_{12}^2)*L_1*L_2 + L_2*L_3 + L_1*L_3 + 2M_{12}*L_3\}/(L_1 + L_2 + 2M_{12})$ $n = (L_1 + L_2 + 2M_{12})/(L_2 + M_{12})$ In the present preferred embodiment, as described above, since the coil L3 (routing pattern L3A) and the coils L1 and L2 magnetically couple with each other, each inductance changes in response to the mutual inductances $M_{12}$, $M_{23}$, and $M_{13}$. Thus, the value of the parasitic inductance Lpst also changes in response to the mutual inductances $M_{12}$, $M_{23}$, and $M_{13}$. More specifically, by contribution from the inductances $L_1$, $L_2$, and $L_3$ being cancelled by contribution from the mutual inductances $M_{12}$, $M_{23}$, and $M_{13}$ in the parasitic inductance Lpst, the value of the parasitic inductance Lpst is decreased. For example, the term of $L_i*L_j$ of the parasitic inductance Lpst changes to $(1-k_{ij}^2)*L_i*L_j$ due to magnetic coupling between a coil Li and a coil Lj. As a result, the transformer of the impedance conversion element 10 is close to the ideal transformer, and thus it is possible to provide matching between the antenna element 21 and the power supply circuit 22 in a wide band.

In addition, in the equivalent circuit 31 (see FIG. 6), when the degree of coupling is high ($k_{12}=1$), the impedance conversion ratio is $L_1+L_2+2M_{12}:L_2+L_3$. Also in the equivalent circuit 32, the impedance conversion ratio is the same as in the equivalent circuit 31, except for contribution of the mutual inductances. As is seen from this, in the impedance conversion element 10, the impedance conversion ratio increases when the inductance $L_1$ increases, and the impedance conversion ratio decreases when the inductance $L_3$ increases. In the impedance conversion element 10, since the inductance $L_3$ is lower than the inductance $L_1$ as described above, it is possible to increase the impedance conversion ratio.

Moreover, in the impedance conversion element 40 of the comparative example, since the uncontributed coil L3 (routing pattern L3A) is connected to the transformer including the coils L1 and L2, the Q-value deteriorates. On the other hand, since the transformer itself does not deteriorate the Q-value, it is possible to consider a transformer to be defined by the coils L1 to L3 by the coil L3 being magnetically coupled with the coils L1 and L2 in the impedance conversion element 10. Thus, in the impedance conversion element 10, even though the coil L3 is connected to the transformer including the coils L1 and L2, the Q-value is less likely to deteriorate. In other words, in the impedance conversion element 10, since it is possible to consider the transformer to be defined by the entire conductor pattern including the routing wire, the Q-value is less likely to deteriorate even when an inductance component occurs in the routing wire.

Figure 8A:
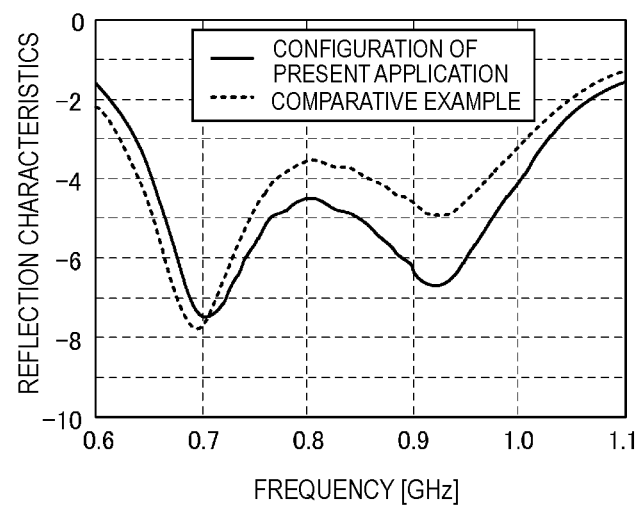
FIG. 8A is a graph showing simulation results of reflection characteristics when a signal is inputted to a power supply terminal T1 in the communication device 20.
Figure 8B:
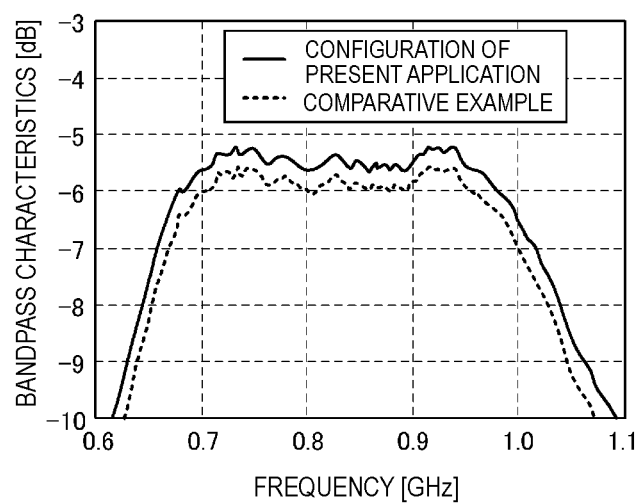
FIG. 8B is a graph showing simulation results of bandpass characteristics between the power supply terminal T1 and an antenna terminal T2 in the communication device 20.
Figure 9A:
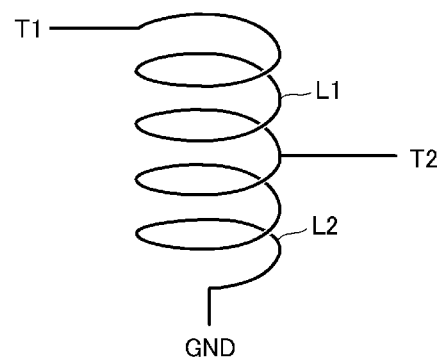
FIGS. 9A and 9B are schematic conceptual diagrams of an existing impedance conversion element.
Figure 9B:
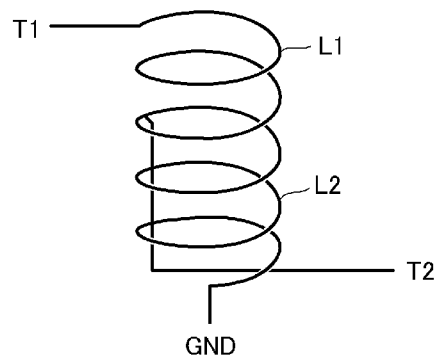

FIG. 8A shows simulation results of reflection characteristics when a signal is inputted to the power supply terminal T1 in the communication device 20. FIG. 8B shows simulation results of bandpass characteristics between the power supply terminal T1 and the antenna terminal T2 in the communication device 20. A solid line represents the result in the communication device 20 of the present preferred embodiment, and a broken line represents the result in a communication device of a comparative example. In the communication device of the comparative example, the impedance conversion element 40 is used instead of the impedance conversion element 10 in the communication device 20. In the simulation, the coupling coefficient of the present preferred embodiment is set as $k_{12}=k_{23}=k_{13}=0.5$, and the coupling coefficient of the comparative example is set as $k_{12}=0.5$, for example.

As shown in FIG. 8A, in the present preferred embodiment, the reflection characteristics improve in the range of about 0.7 GHz to about 1.1 GHz, for example, as compared to those in the comparative example. As shown in FIG. 8B, in the present preferred embodiment, the bandpass characteristics improve in the entire range shown, as compared to those in the comparative example, and the band of the bandpass characteristics is widened. As described above, in the impedance conversion element 10, it is possible to provide matching between the antenna element 21 and the power supply circuit 22 in a wide band, and thus it is possible to widen the band of the bandpass characteristics.

Finally, the description of the above preferred embodiments is illustrative in all respects and not limiting. A person skilled in the art may make modifications and changes as appropriate. The scope of the present invention is determined by the claims, not by the above preferred embodiments. Furthermore, all changes that come within the meaning and range of equivalents of the claims are intended to be embraced in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An impedance conversion element comprising:
a multilayer body including a plurality of laminated insulating layers;
an antenna terminal provided on a surface of the multilayer body and connected to an antenna element;
a power supply terminal provided on the surface of the multilayer body and connected to a power supply circuit;
a ground terminal provided on the surface of the multilayer body and connected to ground;
a first conductor pattern provided within the multilayer body and including a first end connected to the power supply terminal, a second end connected to the antenna terminal, and a loop-shaped portion;

a second conductor pattern provided within the multilayer body and including a first end connected to the antenna terminal and the second end of the first conductor pattern, a second end connected to the ground terminal and magnetically coupled with the first conductor pattern, and a loop-shaped portion; and a routing pattern that connects the second end of the first conductor pattern and the first end of the second conductor pattern to the antenna terminal; wherein the routing pattern extends to magnetically couple with at least either the first conductor pattern or the second conductor pattern.

2. The impedance conversion element according to claim 1, wherein the routing pattern is disposed between the first conductor pattern and the second conductor pattern in a lamination direction of the multilayer body and magnetically couples with both the first conductor pattern and the second conductor pattern.

3. The impedance conversion element according to claim 1, wherein the routing pattern has a lower inductance than the first conductor pattern.

4. The impedance conversion element according to claim 1, wherein the impedance conversion element is a surface mount device.

5. The impedance conversion element according to claim 1, wherein the power supply terminal and the antenna terminal are provided on a first side and a second side of the multilayer body, and the ground terminal is provided on one of a third side and a fourth side of the multilayer body.

6. The impedance conversion element according to claim 1, wherein the multilayer body includes interlayer connection conductors.

7. The impedance conversion element according to claim 1, wherein the routing pattern has a different line width from that of the first conductor pattern and the second conductor pattern.

8. The impedance conversion element according to claim 1, wherein a magnetic field is generated at a center portion of the multilayer body.

9. A communication device comprising:
an impedance conversion element;
an antenna element; and
a power supply circuit; wherein
the impedance conversion element includes:
 a multilayer body including a plurality of laminated insulating layers;
 an antenna terminal provided on a surface of the multilayer body;
 a power supply terminal provided on the surface of the multilayer body;
 a ground terminal provided on the surface of the multilayer body and connected to ground;
 a first conductor pattern provided within the multilayer body and including a first end connected to the power supply terminal, a second end connected to the antenna terminal, and a loop-shaped portion;
 a second conductor pattern provided within the multilayer body and including a first end connected to the antenna terminal and the second end of the first conductor pattern, a second end connected to the ground terminal and magnetically coupled with the first conductor pattern, and a loop-shaped portion; and
 a routing pattern that connects the second end of the first conductor pattern and the first end of the second conductor pattern to the antenna terminal; wherein
 the routing pattern extends to magnetically couple with at least either the first conductor pattern or the second conductor pattern;
 the antenna element is connected to the antenna terminal; and
 the power supply circuit is connected to the power supply terminal.

10. The communication device according to claim 9, wherein the routing pattern is disposed between the first conductor pattern and the second conductor pattern in a lamination direction of the multilayer body and magnetically couples with both the first conductor pattern and the second conductor pattern.

11. The communication device according to claim 9, wherein the routing pattern has a lower inductance than the first conductor pattern.

12. The communication device according to claim 9, wherein the communication device is a portable wireless communication terminal.

13. The communication device according to claim 9, further comprising a printed wiring board on which the impedance conversion element is mounted.

14. The communication device according to claim 9, further comprising a transmission line with a coplanar line structure on the printed wiring board.

15. The communication device according to claim 9, wherein the impedance conversion element is a surface mount device.

16. The communication device according to claim 9, wherein the power supply terminal and the antenna terminal are provided on a first side and a second side of the multilayer body, and the ground terminal is provided on one of a third side and a fourth side of the multilayer body.

17. The communication device according to claim 9, wherein the multilayer body includes interlayer connection conductors.

18. The communication device according to claim 9, wherein the routing pattern has a different line width from that of the first conductor pattern and the second conductor pattern.

19. The communication device according to claim 9, wherein a magnetic field is generated at a center portion of the multilayer body.

* * * * *